United States Patent
Kakura (10) Patent No.: US 6,944,234 B2
(45) Date of Patent: Sep. 13, 2005

(54) CODING METHOD AND APPARATUS FOR REDUCING NUMBER OF STATE TRANSITION PATHS IN A COMMUNICATION SYSTEM

(75) Inventor: Yoshikazu Kakura, Tokyo (JP)

(73) Assignee: NEC Corporation, Tokyo (JP)

( * ) Notice: Subject to any disclaimer, the term of this patent is extended or adjusted under 35 U.S.C. 154(b) by 751 days.

(21) Appl. No.: 09/793,483

(22) Filed: Feb. 27, 2001

(65) Prior Publication Data

US 2001/0022819 A1 Sep. 20, 2001

(30) Foreign Application Priority Data

Mar. 3, 2000 (JP) ........................................ 2000-058157

(51) Int. Cl.[7] .............................. H04L 23/02; H04L 5/12
(52) U.S. Cl. ........................ 375/262; 375/341; 714/794; 714/796
(58) Field of Search ................................ 714/796, 792, 714/794, 795; 375/262, 265, 340, 341

(56) References Cited

U.S. PATENT DOCUMENTS

| | | | | |
|---|---|---|---|---|
| 4,597,090 A | * | 6/1986 | Forney, Jr. ................ | 375/261 |
| 4,807,253 A | * | 2/1989 | Hagenauer et al. ........ | 375/284 |
| 5,150,381 A | * | 9/1992 | Forney et al. ............ | 375/261 |
| 5,436,918 A | | 7/1995 | Kato et al. | |
| 5,537,444 A | * | 7/1996 | Nill et al. ................ | 375/341 |
| 5,646,950 A | * | 7/1997 | Varanasi et al. .......... | 714/792 |
| 5,654,986 A | * | 8/1997 | Lim ........................ | 375/341 |
| 5,901,182 A | * | 5/1999 | Kot ........................ | 375/341 |
| 5,944,849 A | * | 8/1999 | Sonetaka ................. | 714/786 |
| 6,343,103 B1 | * | 1/2002 | Lou et al. ................ | 375/261 |
| 6,366,625 B1 | | 4/2002 | Minami et al. | |
| 6,389,079 B2 | * | 5/2002 | Raheli et al. ............ | 375/262 |
| 6,543,023 B2 | * | 4/2003 | Bessios ................... | 714/758 |
| 6,553,063 B1 | * | 4/2003 | Lin et al. ................ | 375/223 |
| 6,690,739 B1 | * | 2/2004 | Mui ........................ | 375/265 |
| 2002/0114398 A1 | * | 8/2002 | Lin et al. ................ | 375/253 |

FOREIGN PATENT DOCUMENTS

| | | |
|---|---|---|
| GB | 2 252 702 | 8/1992 |
| JP | 5-55932 | 3/1993 |
| JP | 5-183448 | 7/1993 |
| JP | 10-134521 | 5/1998 |
| JP | 11-177641 | 7/1999 |
| JP | 11-186917 | 7/1999 |

* cited by examiner

Primary Examiner—Jean B. Corrielus
(74) Attorney, Agent, or Firm—Foley & Lardner LLP (57) ABSTRACT

A communication system is composed of an encoder encoding an input sequence to sequentially generate output codes $X_0, X_1, \ldots$, and a decoder decoding the output codes by a MLSD (Maximum Likelihood Sequence Detection) method with a trellis memory length being L. The output code $X_k$ of the output codes $X_0, X_1, \ldots$ is determined based on the input sequence for k that is not equal to $i(N+1)$ with i being any of natural numbers and with N being a natural number. The output code $X_{i(N+1)}$ of the output codes $X_0, X_1, \ldots$ are uniquely determined based on a subset of a set consisting of the output codes $X_{i(N+1)-L+1}, X_{i(N+1)-L+2}, \ldots, X_{i(N+1)-1}$ of the output codes $X_0, X_1, \ldots$. The subset includes the output code $X_{1(N+1)-L+1}$ of the output codes $X_{i(N+1)-L+1}, X_{i(N+1)-L+2}, \ldots, X_{1\ (N+1)-1}$.

26 Claims, 4 Drawing Sheets

CODING METHOD AND APPARATUS FOR REDUCING NUMBER OF STATE TRANSITION PATHS IN A COMMUNICATION SYSTEM

BACKGROUND OF THE INVENTION

1. Field of the Invention

The present invention relates to a coding method. More particularly, the present invention relates to a coding method for reducing the number of paths in a state transition of a code sequence.

2. Description of the Related Art

A CCK (Complementary Code Keying) method is one of the typical coding methods. The CCK method employs a code vector C represented by the following equation (1):

$$C = \{C_1, C_2, C_3, C_4, C_5, C_6, C_7, C_8\} \quad (1)$$
$$= \{e^{j(p_1+p_2+p_3+p_4)}, e^{j(p_1+p_3+p_4)}, e^{j(p_1+p_2+p_4)},$$
$$-e^{j(p_1+p_4)}, e^{j(p_1+p_2+p_3)}, e^{j(p_1+p_3)}, -e^{j(p_1+p_2)}, e^{jp_1}\}.$$

Here, $p_1$, $p_2$, $p_3$ and $p_4$ are phases that are respectively determined by two-symbol data. That is, the code vector C includes an 8-symbol data. A set of the code vectors constitutes the Euclidean geometry space.

From the equation (1), $C_4$ is represented by the following equation:

$$C_4 = -\frac{C_2 C_3}{C_1}. \quad (2)$$

$C_4$ is uniquely determined when $C_1$, $C_2$ and $C_3$ are determined, that is, $C_4$ is an insertion code uniquely determined by a subset including input codes $C_1$, $C_2$ and $C_3$ of a set $\{C_k\}$ (k is an integer between 1 and 8).

Moreover, if $C_5$ is determined, $C_6$, $C_7$ and $C_8$ are uniquely determined from the following equation:

$$C_6 = \frac{C_2 C_5}{C_1}, \; C_7 = -\frac{C_3 C_5}{C_1}, \; C_8 = \frac{C_2 C_3 C_5}{C_1^2}. \quad (3)$$

$C_6$, $C_7$ and $C_8$ are insertion codes uniquely determined by $C_1$, $C_2$, $C_3$ and $C_5$.

Let us consider a case that a code coded by CCK method is decoded by a maximum likelihood sequence detection (MLSD) method assuming a trellis memory length to be 3. Here, it is also assumed that each of the codes $C_1, C_2, \ldots, C_8$ is a four-value code having any value of $\pm 1$ and $\pm j$.

Figure 1:
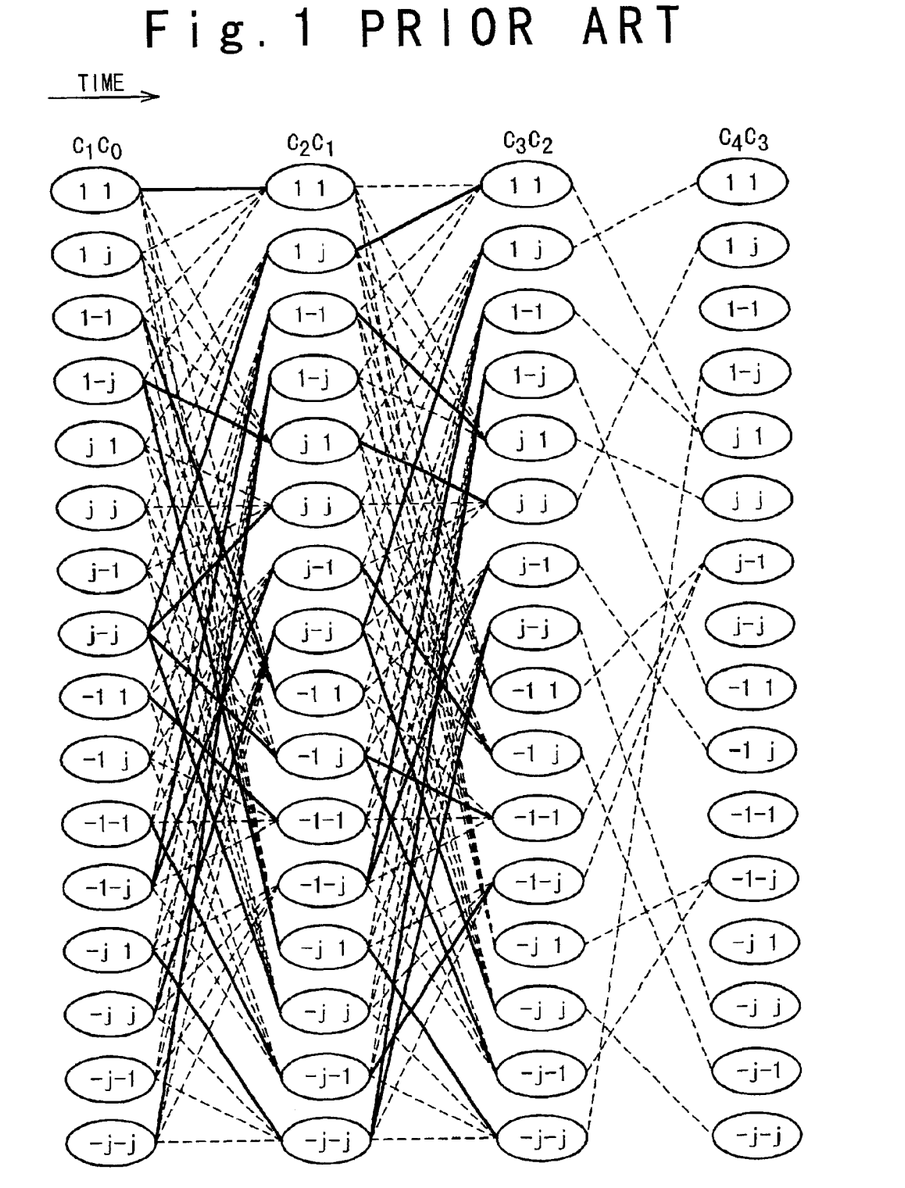
FIG. 1 is a trellis chart showing a state transition when a code coded by a known coding method is decoded.

FIG. 1 is a trellis chart showing a state transition in this case. If the trellis memory length is 3, one state is determined by two continuous codes $C_j$ and $C_{j+1}$ and the other state is determined by $C_{j+1}$ and $C_{j+2}$. Thus, the transition from one state to the other state is determined by three continuous codes. Hereafter, a set consisting of all states determined by the codes $C_j$ and $C_{j+1}$ are noted as a state group $\{C_{j+1}, C_j\}$. Also, a state of $C_{j+1}=\alpha$ and $C_j=\beta$ is noted as a state $(\alpha, \beta)$. Here, both $\alpha$ and $\beta$ have any value of $\pm 1$ and $\pm j$. Therefore, the state group $\{C_{j+1}, C_j\}$ is constituted by 16 states.

Also, a path from a state $(\alpha_1, \beta_1)$ in the state group $\{C_{j+1}, C_j\}$ to a state $(\alpha_2, \beta_2)$ in the state group $\{C_{j+2}, C_{J+1}\}$ is hereinafter noted as a path $(\alpha_1, \beta_1) \rightarrow (\alpha_2, \beta_2)$.

When the code coded by using CCK is decoded by the maximum likelihood sequence detection (MLSD) method, a transition to one of states belonging to a state group $\{C_2, C_1\}$ is done from four states belonging to a state group $\{C_1, C_0\}$. That is, there are four paths reaching one state of the state group $\{C_2, C_1\}$. For example, let us consider a path reaching a state $(1,1)$ in the state group $\{C_2, C_1\}$ from any states included in the state group $\{C_1, C_0\}$. As the path reaching the state $(1,1)$ of the state group $\{C_2, C_1\}$, there are four paths of a path $(1,1)\rightarrow(1,1)$, a path $(1,j)\rightarrow(1,1)$, a path $(1,-1)\rightarrow(1,1)$ and a path $(1,-j)\rightarrow(1,1)$. When the code coded by using CCK is decoded, the maximum likelihood path is selected from the four paths. Similarly, there are four paths reaching one state in the state group $\{C_3, C_2\}$. Then, the maximum likelihood path is selected from the four paths.

On the other hand, there is only one path reaching one state in the state group $\{C_4, C_3\}$ because of the existence of the relation of the equation (2). That is, each of the states included in the state group $\{C_2, C_1\}$ corresponds to one of the states included in the state group $\{C_2, C_1\}$. In this way, the number of paths reaching one state in the state group $\{C_4, C_3\}$ is limited to a quarter of the number of paths reaching one state in the state group $\{C_2, C_1\}$ and the state group $\{C_3, C_2\}$. Thus, a metric between paths is extended to thereby reduce a probability of an selection error of a path.

In the coding method, a portion in which a coding gain is practically used is $C_4$, $C_6$, $C_7$ and $C_8$ in the code vector C. Thus, there is the deviation in the portion in which the coding gain is practically used. This results from the fact that a system estimation is carried out by using the state transition determined by the trellis memory length shorter than the number of symbols serving as a unit.

Moreover, if the number of previous input codes determining the state transition is greater than a trellis memory length, an irregularity is induced in which there are a plurality of paths reaching a certain state, and on the other hand, there is no path reaching a certain state. The coding method having such deviation and irregularity is not optimal.

It is desired that the path is regularly reduced without any deviation, the existence of the path is not irregular and the code gain is effectively used.

Other coding methods are disclosed in Japanese Laid Open Patent Application (Jp-A-Heisei 10-134521 and Jp-A-Heisei 11-186917), which may be related to the present invention described below. However, both of the other coding methods does not teach a technique reducing the deviation and irregularity in the generated codes.

SUMMARY OF THE INVENTION

Therefore, an object of the present invention is to provide a coding method in which the path is regularly reduced without any deviation, the existence of the path is not irregular and the code gain is effectively used.

In order to achieve an aspect of the present invention a communication system is composed of an encoder encoding an input sequence to sequentially generate output codes $X_0, X_1, \ldots$, and a decoder decoding the output codes by a MLSD (Maximum Likelihood Sequence Detection) method with a trellis memory length being L. The output code $X_k$ of the output codes $X_0, X_1, \ldots$ is determined based on the input sequence for k that is not equal to $i(N+1)$ with i being any of natural numbers and with N being a natural number. And the output code $X_{i(N+1)}$ of the output codes $X_0, X_1, \ldots$ are uniquely determined based on a subset of a set consisting of the output codes $X_{i(N+1)-L+1}, X_{i(N+1)-L+2}, \ldots, X_{i(N+1)-1}$ of the output codes $X_0, X_1, \ldots$. The subset includes the output code $X_{i(N+1)-L+1}$ of the output codes $X_{i(N+1)-L+1}, X_{i(N+1)-L+2}, \ldots, X_{i(N+1)-1}$.

In this case, the N may be one, and the output code $X_{2i}$ may be expressed as:

$$X_{2i} = f(X_{2i-1}, X_{2i-2}, \ldots, X_{2i-L+1}),$$

where f is a function.

Also, the output code $X_{2i}$ may be expressed as:

$$X_{2i} = q \cdot X_{2i-1} \cdot X_{2i-2} \cdot \ldots \cdot X_{2i-L+1},$$

where q is an number selected from a group consisting of 1, $-1$, j, and $-j$.

Also, the input sequence may include input codes $a_0$, $a_1$, ... sequentially inputted to the encoder. In this case, the output code $X_k$ for k that is not equal to $i(N+1)$ may be expressed as:

$$X_0 = a_0, (k=0)$$

$$X_{i(N+1)-p} = a_{iN-(p-1)} (k \neq 0).$$

where p is any of integers between 1 to N.

In order to achieve another aspect of the present invention, a communication system is composed of an encoder encoding an input sequence to sequentially generate output codes $X_0, X_1, \ldots$, and a decoder decoding the output codes by a MLSD (Maximum Likelihood Sequence Detection) method with a trellis memory length being L. The output code $X_k$ of the output codes $X_0, X_1, \ldots$ is determined based on the input sequence for k that is not equal to $i(N+1)$ with i being any of natural numbers and with N being a natural number. And the output code $X_{i(N+1)}$ of the output codes $X_0, X_1, \ldots$ is uniquely determined based on the output code $X_{i(N+1)-L+1}$ of the output codes $X_0, X_1, \ldots$ The N may be one. In this case, the output code $X_{2i}$ may be expressed as:

$$X_{2i} = f(X_{2i-L+1}),$$

where f is a function.

Also, the output code $X_{2i}$ is expressed as:

$$X_{2i} = q \cdot X_{2i-L+1},$$

where q is an number selected from a group consisting of 1, $-1$, j, and $-j$.

In order to achieve still another aspect of the present invention, an encoder is composed of input means for being inputted by an input sequence and encoding means for encoding the input sequence to sequentially generate output codes $X_0$, $X_1$, which are to be decoded by a MLSD (Maximum Likelihood Sequence Detection) method with a trellis memory length being L. The output code $X_k$ of the output codes $X_0, X_1, \ldots$ is determined based on the input sequence for k that is not equal to $i(N+1)$ with i being any of natural numbers and with N being a natural number. And the output code $X_{i(N+1)}$ of the output codes $X_0, X_1, \ldots$ are uniquely determined based on a subset of a set consisting of the output codes $X_{i(N+1)-L+1}, X_{i(N+1)-L+2}, \ldots, X_{i(N+1)-1}$ of the output codes $X_0, X_1, \ldots$ The subset includes the output code $X_{i(N+1)-L+1}$ of the output codes $X_{i(N+1)-L+1}$, $X_{i(N+1)-L+2}, \ldots, X_{i(N+1)-1}$.

In order to achieve yet still aspect of the present invention, an encoder is composed of input means for being inputted by an input sequence and encoding means for encoding the input sequence to sequentially generate output codes $X_0$, $X_1, \ldots$ which are to be decoded by a MLSD (Maximum Likelihood Sequence Detection) method with a trellis memory length being L. The output code $X_k$ of the output codes $X_0, X_1, \ldots$ is determined based on the input sequence for k that is not equal to $i(N+1)$ with i being any of natural numbers and with N being a natural number. And the output code $X_{i(N+1)}$ of the output codes $X_0, X_1, \ldots$ is uniquely determined based on the output code $X_{i(N+1)-L+1}$ of the output codes $X_0, X_1, \ldots$ In order to achieve still another aspect of the present invention, a method of communication is composed of:

encoding an input sequence to sequentially generate output codes $X_0, X_1, \ldots$; and decoding the output codes by a MLSD (Maximum Likelihood Sequence Detection) method with a trellis memory length being L. The encoding includes:

determining the output code $X_k$ of the output codes $X_0$, $X_1, \ldots$ based on the input sequence for k that is not equal to $i(N+1)$ with i being any of natural numbers and with N being a natural number, and determining the output code $X_{i(N+1)}$ of the output codes $X_0, X_1$, based on a subset of a set consisting of the output codes $X_{i(N+1)-L+1}, X_{i(N+1)-L+2}, \ldots, X_{i(N+1)-1}$ of the output codes $X_0, X_1, \ldots$ The subset includes the output code $X_{i(N+1)-L+1}$ of the output codes $X_{i(N+1)-L+1}, X_{i(N+1)-L+2}, \ldots, X_{i(N+1)-1}$.

In order to achieve still another aspect of the present invention, a method of communication is composed of:

encoding an input sequence to sequentially generate output codes $X_0, X_1, \ldots$; and decoding the output codes by a MLSD (Maximum Likelihood Sequence Detection) method with a trellis memory length being L. The encoding includes:

determining the output code $X_k$ of the output codes $X_0$, $X_1, \ldots$ based on the input sequence for k that is not equal to $i(N+1)$ with i being any of natural numbers and with N being a natural number, and determining the output code $X_{i(N+1)}$ of the output codes $X_0, X_1, \ldots$ based only on the output code $X_{i(N+1)-L+1}$ of the output codes $X_0, X_1 \ldots$ In order to achieve still another aspect of the present invention, a method of encoding is composed of:

inputting an input sequence; and encoding an input sequence to sequentially generate output codes $X_0, X_1, \ldots$ which are to be decoded by a MLSD (Maximum Likelihood Sequence Detection) method with a trellis memory length being L. The encoding includes:

determining the output code $X_k$ of the output codes $X_0$, $X_1, \ldots$ based on the input sequence for k that is not equal to $i(N+1)$ with i being any of natural numbers and with N being a natural number, and determining the output code $X_{i(N+1)}$ of the output codes $X_0, X_1, \ldots$ based on a subset of a set consisting of the output codes $X_{i(N+1)-L+1}, X_{i(N+1)-L+2} \cdot \cdot \cdot X_{i(N+1)-1}$ of the output codes $X_0, X_1, \ldots$, and wherein the subset includes the output code $X_{i(N+1)-L+1}$ of the output codes $X_{i(N+1)-L+1}, X_{i(N+1)-L+2}, \ldots, X_{i(N+1)-1}$.

In order to achieve still another aspect of the present invention, a method of encoding is composed of:

inputting an input sequence; and encoding an input sequence to sequentially generate output codes $X_0, X_1 \ldots$ which are to be decoded by a MLSD (Maximum Likelihood Sequence Detection) method with a trellis memory length being L. The encoding includes:

determining the output code $X_k$ of the output codes $X_0$, $X_1, \ldots$ based on the input sequence for k that is not equal to $i(N+1)$ with i being any of natural numbers and with N being a natural number, and determining the output code $X_{i(N+1)}$ of the output codes $X_0, X_1, \ldots$ based only on the output code $X_{i(N+1)-L+1}$ of the output codes $X_0, X_1, \ldots$

DESCRIPTION OF THE PREFERRED EMBODIMENTS

Figure 2:
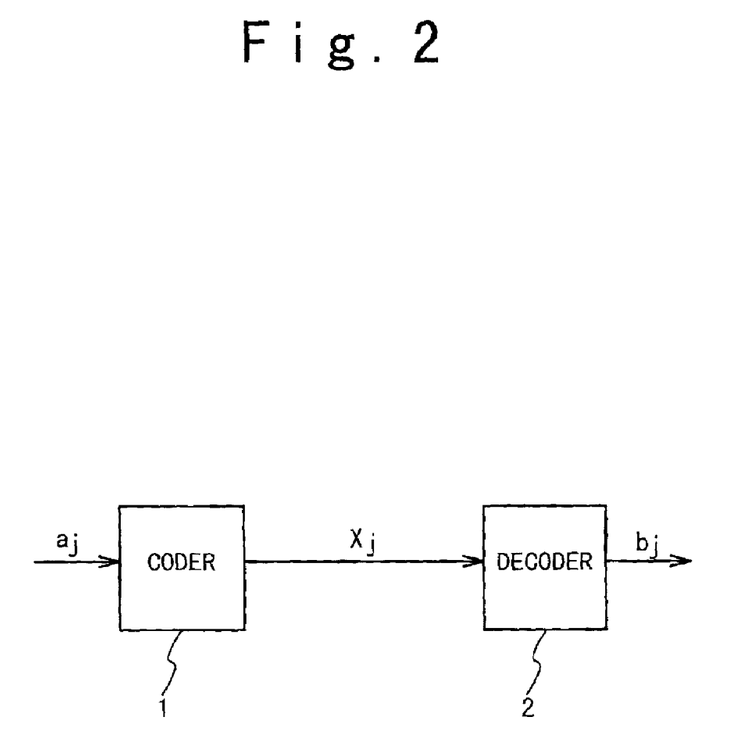
FIG. 2 shows a communication system in which an information is communicated by using a coding method of an embodiment of the present invention.

FIG. 2 shows a communication system in which information is sent by using a coding method of an embodiment of the present invention.

The communication system is provided with an encoder 1 and a decoder 2. An input information sequence $\{a_k\}$ is inputted to the encoder 1. The input information sequence $\{a_k\}$ is composed of codes $a_0, a_1, a_2, \ldots$. The encoder 1 codes the input information sequence $\{a_k\}$, and generates an output sequence $\{X_k\}$. The output sequence $\{X_k\}$ consists of codes $X_0, X_1, X_2, X_3, \ldots$ The encoder 1 generates the output sequence $\{X_k\}$ under the assumption that the output sequence $\{X_k\}$ is decoded at a trellis memory length of L. The encoder 1 inserts one insertion code for N symbols in the input information sequence $\{a_k\}$ to generate the output sequence $\{X_k\}$. That is, the encoder 1 generates the output sequence $\{X_k\}$ such that an insertion interval of an insertion code is N. Here, N is an integer equal to or greater than 1.

For k that is not equal to $i \times (N+1)$, codes $X_k$ included in the output sequence $\{X_k\}$ are expressed as follows:

$$X_0 = a_0,$$
$$\vdots$$
$$X_{i \cdot (N+1)-N} = a_{i \cdot N-(N-1)},$$
$$X_{i \cdot (N+1)-(N-1)} = a_{i \cdot N-(N-2)},$$
$$\vdots$$
$$X_{i \cdot (N+1)-p} = a_{i \cdot N-(p-1)},$$
$$\vdots$$
$$X_{i \cdot (N+1)-1} = a_{i \cdot N}.$$

where, i is an integer equal to or greater than 1 and p is an integer between 1 and N.

For k that is equal to $i \times (N+1)$, on the other hand, each of insertion codes $X_k$ is uniquely determined by a subset G' of a set G consisting of (L-1) codes $X_{i(N+1)-L+1}$, $X_{i(N+1)-L+2}, \ldots X_{i(N+1)-1}$, where the subset G' includes the code $X_{i(N+1)-L+1}$. That is, $$X_{i(N+1)} = f(G')$$

f is a predetermined function.

The decoder 2 decodes the output sequence $\{X_k\}$ by the MLSD method at the trellis memory length of L to output a reception code sequence $\{b_k\}$ consisting of codes $b_0, b_1, b_2, \ldots$ In this coding method used in the communication system, the deviation in the path is reduced by the insertion of the insertion code $X_{i(N+1)}$. Thus, the code gain is effectively used.

The process for generating the output sequence $\{X_k\}$ into which the insertion code $X_{i(N+1)}$ is inserted will be actually described below.

Approach 1

Let us suppose that codes $a_k$ included in the input information sequence $\{a_k\}$ inputted to the encoder 1 are a four-value code having any value of $\pm 1$ and $\pm j$. Moreover, the encoder 1 generates the output sequence $\{X_k\}$ with the trellis memory length L being 3 and with the insertion interval N being 1. In this case, the code $X_0$ which is not an insertion code, is represented as follows:

$$X_0 = a_0. \tag{4}$$

Moreover, the code $X_{2i-1}$ that are not insertion codes are represented as follows:

$$X_{2i-1} = a_i. \tag{5}$$

i is an integer equal to or greater than 1. Also, the insertion code $X_{2i}$ are inserted into the output sequence $\{X_k\}$. At this time, the following equation is given:

$$X_{2i} = X_{2i-1} \cdot X_{2i-2}. \tag{6}$$

Each of codes $X_k$ is a four-value code having any value of $\pm 1$ and $\pm j$. Here, k is an integer equal to or greater than 0.

The output sequence $\{X_k\}$ is decoded by the decoder 2 by the MLSD method. The decoder 2 carries out the decoding operation with the trellis memory length L being 3.

Figure 3:
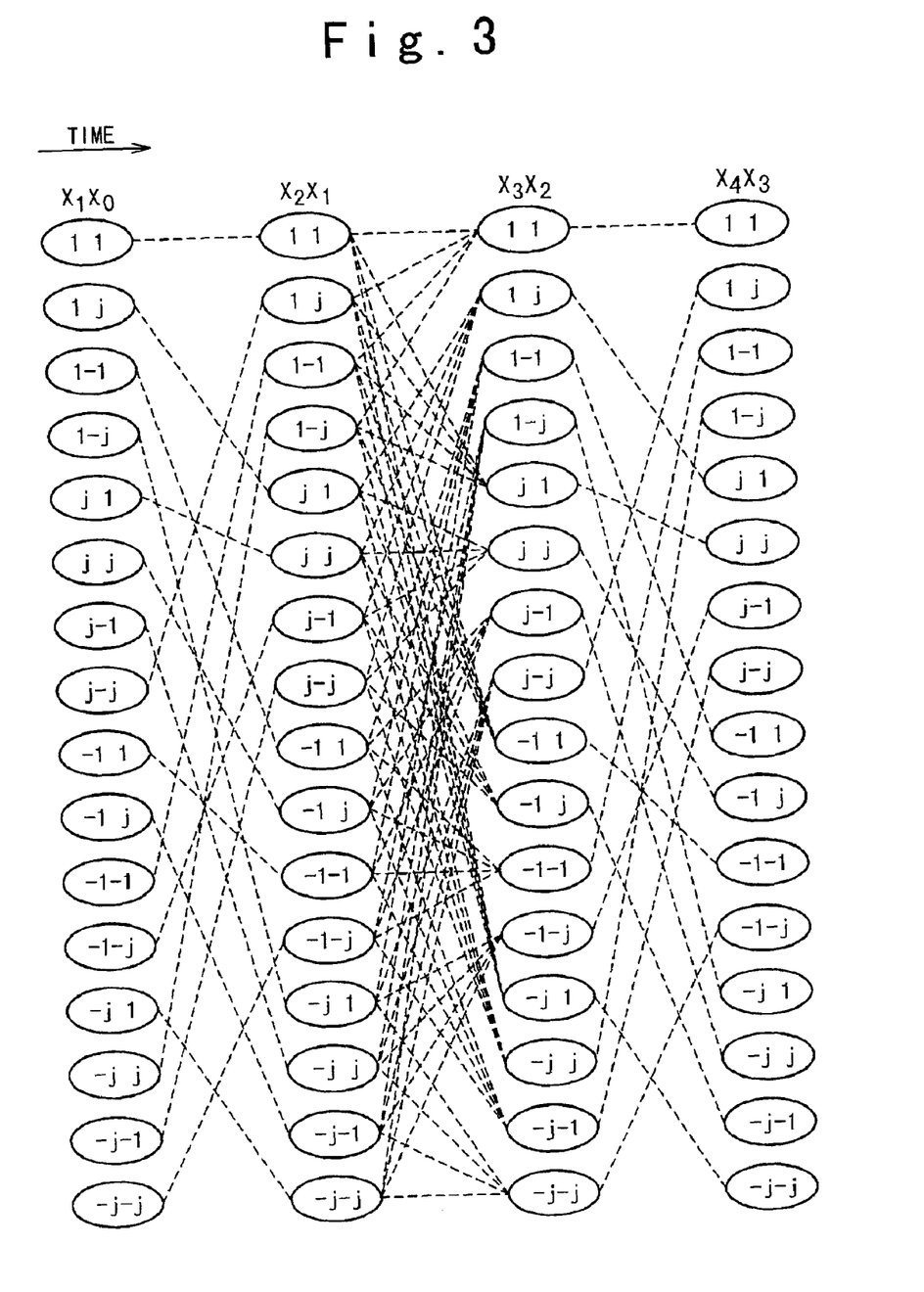
FIG. 3 is a trellis chart showing a state transition when a code coded by a coding method of an embodiment of the present invention is decoded.

FIG. 3 is a trellis chart showing a state transition when the thus-generated output sequence $\{X_k\}$ is decoded.

Let us consider a transition from a state belonging to the state group $\{X_{2i}, X_{2i-1}\}$ to a state belonging to the state group $\{X_{2i+1}, X_{2i}\}$. There are four paths reaching one state in the state group $\{X_{2i+1}, X_{2i}\}$. For example, let us suppose a path reaching from a state belonging to the state group $\{X_2, X_1\}$ to one state in the state group $\{X_3, X_2\}$. As a path reaching a state (1,1) in the state group $\{X_3, X_2\}$, there are four paths of a path (1,1)→(1,1), a path (1,j)→(1,1), a path (1,-1)→(1,1) and a path (1,-j)→(1,1).

On the other hand, in the transition from a state belonging to the state group $\{X_{2i-1}, X_{2i-2}\}$ to a state belonging to the state group $\{X_{2i}, X_{2i-1}\}$, the code $X_{2i}$ is uniquely determined by $X_{2i-1}$ and $X_{2i-2}$. The path reaching one state in the state group $\{X_{2i}, X_{2i-1}\}$ is limited to one. For example, let us suppose a transition from a state belonging to the state group $\{X_1, X_0\}$ to a state belonging to the state group $\{X_2, X_1\}$. The path transiting to a state (1,1) in the state group $\{X_2, X_1\}$ is limited to the path (1,1)→(1,1) in accordance with the equation (6). That is, it is necessary to satisfy the following equation (6'):

$$X_0 = X_2/X_1 \tag{6'}$$

At a time of a decoding operation, if it is decoded as $(X_2, X_1) = (1,1)$, the maximum likelihood path is only the path (1,1)→(1,1). Thus, it is uniquely determined that $(X_1, X_0) = (1,1)$. Only one path is uniquely determined even for another state in the state group $\{X_1, X_0\}$. One state in the state group $\{X_{2i-1}, X_{2i-2}\}$ corresponds to one state in the state group $\{X_{2i}, X_{2i-1}\}$ in a one-to-one relationship.

As mentioned above, there are the four paths reaching the states belonging to the state group $\{X_{2i+1}, X_{2i}\}$, determined by the codes $X_{2i+1}$ and $X_{2i}$. The path reaching the states belonging to the state group $\{X_{2i}, X_{2i-1}\}$ determined by the codes $X_{2i}$ and $X_{2i-1}$ is reduced to one. In this way, the reduction in the path is regularly done without any deviation.

The above-mentioned equation (6) can be expanded when the trellis memory length is a value except 3. It is typically represented as follows.

$$X_{2i} = X_{2i-1} \cdot X_{2i-2} \cdot \ldots \cdot X_{2i-L+1} \quad (6'')$$

or $$X_{2i} = -X_{2i-1} \cdot X_{2i-2} \cdot \ldots \cdot X_{2i-L+1}$$

or $$X_{2i} = \pm j X_{2i-1} \cdot X_{2i-2} \cdot \ldots \cdot X_{2i-L+1}$$

Moreover, in the above-mentioned coding process, it should be noted that N is not limited to 1.

Approach 2

Let us suppose that a code $a_k$ included in the input information sequence $\{a_k\}$ is a four-value code having any value of ±1 and ±j. Here, k is an integer equal to or greater than 0. Moreover, the encoder 1 generates the output sequence $\{X_k\}$ with the trellis memory length L being 3 and with the insertion interval N being 1. In this case, the code $X_0$, which is not the insertion code, is represented as follows:

$$X_0 = a_0. \quad (7)$$

Moreover, the codes $X_{2i-1}$, which are not the insertion code, are represented as follows:

$$X_{2i-1} = a_i. \quad (8)$$

where i is an integer equal to or greater than 1. Also, the insertion codes $X_{2i}$ are inserted into the output sequence $\{X_k\}$. The insertion codes $X_{2i}$ are given as follows:

$$X_{2i} = j X_{2i-2}. \quad (9)$$

Figure 4:
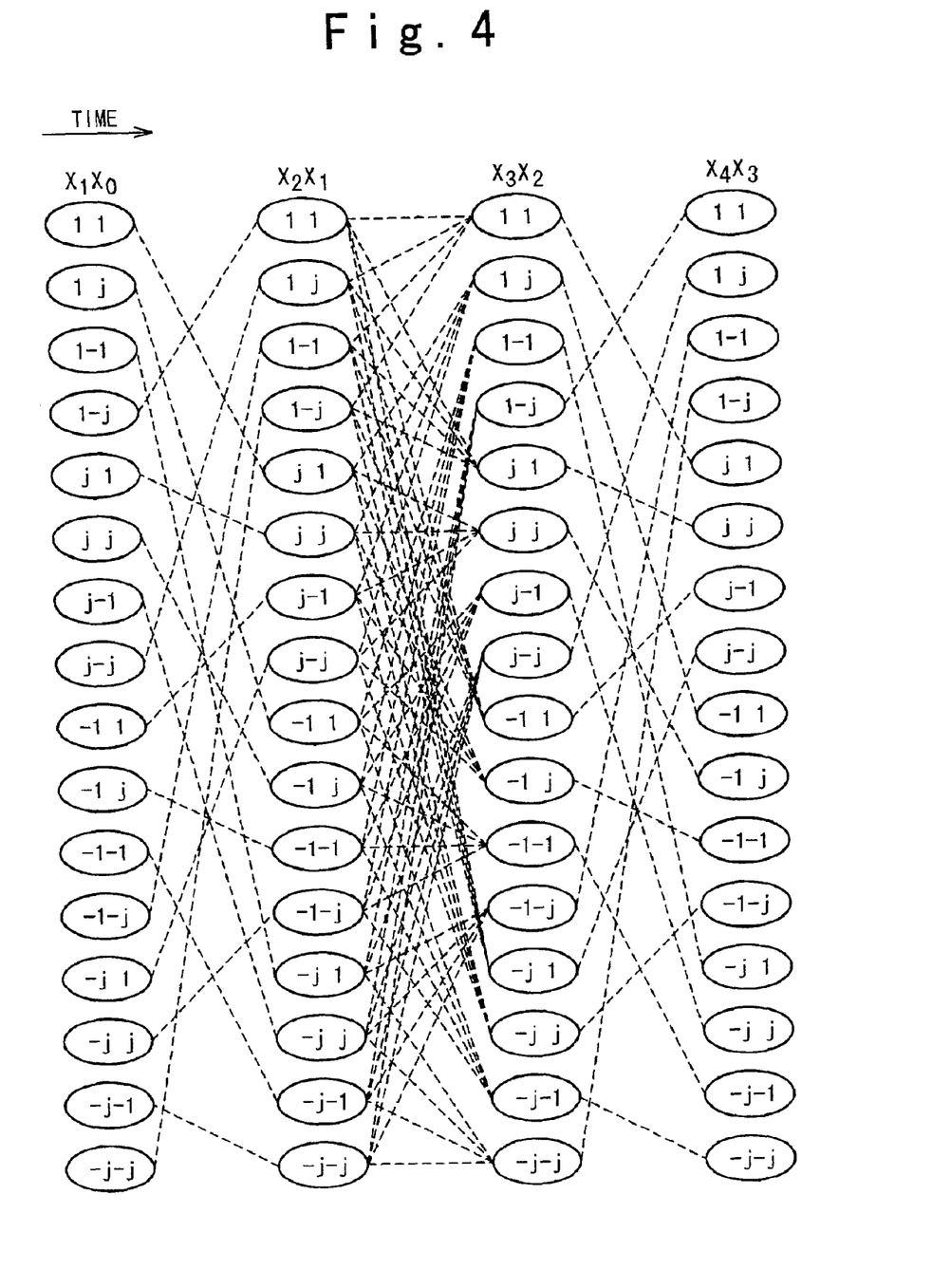
FIG. 4 is a trellis chart showing a state transition when a code coded by a coding method of an embodiment of the present invention is decoded.

FIG. 4 is a trellis chart showing a state transition when the thus-generated output sequence $\{X_k\}$ is decoded.

Let us consider a transition from a state belonging to the state group $\{X_{2i}, X_{2i-1}\}$ to a state belonging to the state group $\{X_{2i+1}, X_{2i}\}$. There are four paths reaching one state in the state group $\{X_{2i+1}, X_{2i}\}$.

In the transition from a state belonging to the state group $\{X_{2i-1}, X_{2i-2}\}$ to a state belonging to the state group $\{X_{2i}, X_{2i-1}\}$, on the other hand, the code $X_{2i}$ is uniquely determined by $X_{2i-2}$. The number of the path reaching one state in the state group $\{X_{2i}, X_{2i-1}\}$ is limited to one. For example, let us suppose a transition from a state belonging to the state group $\{X_1, X_0\}$ to a state belonging to the state group $\{X_2, X_1\}$. The path transiting to a state (1,1) in the state group $\{X_2, X_1\}$ is limited to the path (1,-j)→(1,1) in accordance with the equation (9). That is, it is necessary to satisfy the following equation:

$$X_0 = X_2/j \quad (9')$$

At a decoding operation, if it is decoded as $(X_2, X_1) = (1,1)$, the maximum likelihood path is only the path (1,-j)→(1,1). Thus, it is uniquely determined that $(X_1, X_0) = (1,-j)$. Only one path is uniquely determined even for another state in the state group $\{X_1, X_0\}$. One state in the state group $(X_{2i-1}, X_{2i-2})$ corresponds to one state in the state group $\{X_{2i}, X_{2i-1}\}$ in a one-to-one relationship.

As mentioned above, there are the four paths reaching the states belonging to the state group $\{X_{2i+1}, X_{2i}\}$ determined by the codes $X_{2i+1}$ and $X_{2i}$. The number of the paths reaching the states belonging to the state group $\{X_{2i}, X_{2i-1}\}$ determined by the codes $X_{2i}$ and $X_{2i-1}$ is reduced to one. In this way, the reduction in the path is regularly done without any deviation.

The above-mentioned equation (9) can be expanded when the trellis memory length is a value except 3. It is typically represented as follows.

$$X_{2i} = \pm j X_{2i-L+1}, \quad (10)$$

or $$X_{2i} = \pm X_{2i-L+1}$$

Moreover, in the above-mentioned coding process, it should be noted that N is not limited to 1.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A communication system comprising:
   an encoder encoding an input sequence to sequentially generate output codes $X_0, X_1, \ldots$; and
   a decoder decoding said output codes by a MLSD (Maximum Likelihood Sequence Detection) method with a trellis memory length being L,
   wherein said output code $X_k$ of said output codes $X_0, X_1, \ldots$ is determined based on said input sequence for k that is not equal to i(N+1) with i being any of natural number and with N being a natural number, and
   wherein said output code $X_{i(N+1)}$ of said output codes $X_0, X_1, \ldots$ are uniquely determined based on a subset of a set consisting of output codes $X_{i(N+1)-L+1}, X_{i(N+1)-L+2}, \ldots, X_{i(N+1)-1}$ of said output codes $X_0, X_1, \ldots,$ and
   wherein said subset includes output code $X_{i(N+1)-L+1}$ of said output codes $X_{i(N+1)-L+1}, X_{i(N+1)-L+2}, \ldots, X_{i(N+1)-1}.$ 2. The communication system according to claim 1, wherein said N is one, and output code $X_{2i}$ is expressed as:

$$X_{2i} = f(X_{2i-1}, X_{2i-2}, \ldots, X_{2i-L+1}),$$

where f is a function.

3. The communication system according to claim 2, wherein said output code $X_{2i}$ is expressed as:

$$X_{2i} = q \cdot X_{2i-1} \cdot X_{2i-2} \cdot \ldots \cdot X_{2i-L+1},$$

where q is an number selected from a group consisting of 1, −1, j, and −j.

4. The communication system according to claim 1, wherein said input sequence includes input codes $a_0, a_1, \ldots$ sequentially inputted to said encoder, and
   wherein said output code $X_k$ for k that is not equal to i(N+1) is expressed as:

$$X_0 = a_0, (k=0)$$

$$X_{i(N+1)-p} = a_{iN-(p-1)} (k \neq 0),$$

where p is any of integers between 1 to N.

5. A communication system comprising:
   an encoder encoding an input sequence to sequentially generate output codes $X_0, X_1, \ldots$; and a decoder decoding said output codes by a MLSD (Maximum Likelihood Sequence Detection) method with a trellis memory length being L, wherein output code $X_k$ of said output codes $X_0, X_1, \ldots$ is determined based on said input sequence for k that is not equal to i(N+1) with i being any of natural numbers and with N being a natural number, and wherein output code $X_{i(N+1)}$ of said output codes $X_0, X_1, \ldots$ is uniquely determined based on output code $X_{i(N+1)-L+1}$ of said output codes.

6. The communication system according to claim 5, wherein said N is one, output code $X_{2i}$ is expressed as:

$$X_{2i}=f(X_{2i-L+1}),$$

where f is a function.

7. The communication system according to claim 6, wherein said output code $X_{2i}$ is expressed as:

$$X_{2i}=q \cdot X_{2i-L+1},$$

where q is an number selected from a group consisting of 1, −1, j, and −j.

8. The communication system according to claim 5, wherein said input sequence includes input codes $a_0, a_1, \ldots$ sequentially inputted to said encoder, and wherein said output codes $X_k$ for k that is not equal to i(N+1) is expressed as:

$$X_0=a_0, \ (k=0)$$
$$X_{i(N+1)-p}=a_{iN-(p-1)}(k \neq 0)$$

where p is any of integers between 1 to N.

9. An encoder comprising:

input means for being inputted by an input sequence;

encoding means for encoding said input sequence to sequentially generate output codes $X_0, X_1, \ldots$ which are to be decoded by a MLSD (Maximum Likelihood Sequence Detection) method with a trellis memory length being L, wherein output code $X_k$ of said output codes $X_0, X_1, \ldots$ is determined based on said input sequence for k that is not equal to i(N+1) with i being any of natural numbers and with N being a natural number, and wherein output code $X_{i(N+1)}$ of said output codes $X_0, X_1, \ldots$ are uniquely determined based on a subset of a set consisting of said output codes $X_{i(N+1)-L+1}, X_{i(N+1)-L+2}, \ldots, X_{i(N+1)-1}$ of said output codes $X_0, X_1, \ldots$, and wherein said subset includes said output code $X_{i(N+1)-L+1}$ of said output codes $X_{i(N+1)-L+1}, X_{i(N+1)-L+2}, \ldots, X_{i(N+1)-1}$.

10. The encoder according to claim 9, wherein said N is one, and output code $X_{2i}$ is expressed as:

$$X_{2i}=f(X_{2i-1}, X_{2i-2}, \ldots, X_{2i-L+1})$$

where f is a function.

11. The encoder according to claim 10, wherein said output code $X_{2i}$ is expressed as:

$$X_{2i}=q \cdot X_{2i-1} \cdot X_{2i-2} \cdot \ldots \cdot X_{2i-L+1},$$

where q is a number selected from a group consisting of 1, −1, j, and −j.

12. The encoder according to claim 9, wherein said input sequence includes input codes $a_0, a_1, \ldots$ sequentially inputted to said input means, and wherein said output code $X_k$ for k that is not equal to i(N+1) are expressed as:

$$X_0=a_0, \ (k=0)$$
$$X_{i(N+1)-p}=a_{iN-(p-1)}(k \neq 0),$$

where p is any of integers between 1 to N.

13. An encoder comprising:

input means for being inputted by an input sequence;

encoding means for encoding said input sequence to sequentially generate output codes $X_0, X_1, \ldots$ which are to be decoded by a MLSD (Maximum Likelihood Sequence Detection) method with a trellis memory length being L, wherein output code $X_k$ of said output codes $X_0, X_1, \ldots$ is determined based on said input sequence for k that is not equal to i(N+1) with i being any of natural numbers and with N being a natural number, and wherein output code $X_{i(N+1)}$ of said output codes $X_0, X_1, \ldots$ is uniquely determined based on output code $X_{i(N+1)-L+1}$ of said output codes.

14. The encoder according to claim 13, wherein said N is one, and output code $X_{2i}$ is expressed as:

$$X_{2i}=f(X_{2i-L+1}),$$

where f is a function.

15. The encoder according to claim 14, wherein said output code $X_{2i}$ is expressed as:

$$X_{2i}=q \cdot X_{2i-L+1},$$

where q is a number selected from a group consisting of 1, −1, j, and −j.

16. The encoder according to claim 13, wherein said input sequence includes input codes $a_0, a_1, \ldots$ sequentially inputted to said input means, and wherein said output codes $X_k$ for k that is not equal to i(N+1) is expressed as:

$$X_0=a_0, \ (k=0)$$
$$X_{i(N+1)-p}=a_{iN-(p-1)}(k \neq 0),$$

where p is any of integers between 1 to N.

17. A method comprising:

encoding an input sequence to sequentially generate output codes $X_0, X_1, \ldots$; and decoding said output codes by a MLSD (Maximum Likelihood Sequence Detection) method with a trellis memory length being L, wherein said encoding includes:

determining output code $X_k$ of said output codes $X_0, X_1, \ldots$ based on said input sequence for k that is not equal to i(N+1) with i being any of natural numbers and with N being a natural number, and determining output code $X_{i(N+1)}$ of said output codes $X_0, X_1, \ldots$ based on a subset of a set consisting of output codes $X_{i(N+1)-L+1}, X_{i(N+1)-L+2}, \ldots, X_{i(N+1)-1}$ of said output codes $X_0, X_1, \ldots$, and wherein said subset includes said output code $X_{i(N+1)-L+1}$ of said output codes $X_{i(N+1)-L+1}, X_{i(N+1)-L+2}, \ldots, X_{i(N+1)-1}$.

18. A method comprising:

encoding an input sequence to sequentially generate output codes $X_0, X_1, \ldots$; and decoding said output codes by a MLSD (Maximum Likelihood Sequence Detection) method with a trellis memory length being L, wherein said encoding includes:

determining output code $X_k$ of said output codes $X_0, X_1, \ldots$ based on said input sequence for k that is not equal to i(N+1) with i being any of natural numbers and with N being a natural number, and determining output code $X_{i(N+1)}$ of said output codes $X_0, X_1, \ldots$ based only on output code $X_{i(N+1)-L+1}$ of said output codes.

19. A method of encoding comprising:

inputting an input sequence; and encoding an input sequence to sequentially generate output codes $X_0, X_1, \ldots$ which are to be decoded by a MLSD (Maximum Likelihood Sequence Detection) method with a trellis memory length being L, wherein said encoding includes:

determining output code $X_k$ of said output codes $X_0, X_1, \ldots$ based on said input sequence for k that is not equal to i(N+1) with i being any of natural numbers and with N being a natural number, and determining output code $X_{i(N+1)}$ of said output codes $X_0, X_1, \ldots$ based on a subset of a set consisting of output codes $X_{i(N+1)-L+1}, X_{i(N+1)-L+2}, \ldots, X_{i(N+1)-1}$ of said output codes $X_0, X_1, \ldots$, and wherein said subset includes said output code $X_{i(N+1)-L+1}$ of said output codes $X_{i(N+1)-L+1}, X_{i(N+1)-L+2}, \ldots, X_{i(N+1)-1}$.

20. The method according to claim 19, wherein said N is one, and output code $X_{2i}$ is expressed as:

$$X_{2i}=f(X_{2i-1}, X_{2i-2}, \ldots, X_{2i-L+1}),$$

where f is a function.

21. The method according to claim 20, wherein said output code $X_{2i}$ is expressed as:

$$X_{2i}=q \cdot X_{2i-1} \cdot X_{2i-2} \cdot \ldots \cdot X_{2i-L+1},$$

where q is an number selected from a group consisting of 1, −1, j, and −j.

22. The method according to claim 19, wherein said input sequence includes input codes $a_0, a_1, \ldots$ which are sequentially inputted, and wherein said output code $X_k$ for k that is not equal to i(N+1) are expressed as:

$$X_0=a_0, (k=0)$$

$$X_{i(N+1)-p}=a_{iN-(p-1)} (k \neq 0),$$

where p is any of integers between 1 to N.

23. A method of encoding comprising:

inputting an input sequence; and encoding said input sequence to sequentially generate output codes $X_0, X_1, \ldots$ which are to be decoded by a MLSD (Maximum Likelihood Sequence Detection) method with a trellis memory length being L, wherein said encoding includes:

determining output code $X_k$ of said output codes $X_0, X_1, \ldots$ based on said input sequence for k that is not equal to i(N+1) with i being any of natural numbers and with N being a natural number, and determining output code $X_{i(N+1)}$ of said output codes $X_0, X_1, \ldots$ based only on output code $X_{i(N+1)-L+1}$ of said output codes.

24. The method according to claim 23, wherein said N is one, and output code $X_{2i}$ is expressed as:

$$X_{2i}=f(X_{2i-L+1}),$$

where f is a function.

25. The method according to claim 24, wherein said output code $X_{2i}$ is expressed as:

$$X_{2i}=q \cdot X_{2i-L+1},$$

where q is an number selected from a group consisting of 1, −1, j, and −j.

26. The method according to claim 23, wherein said input sequence includes input codes $a_0, a_1, \ldots$ which are sequentially inputted, and wherein said output codes $X_k$ for k that is not equal to i(N+1) is expressed as:

$$X_0=a_0, (k=0)$$

$$X_{i(N+1)-p}=a_{iN-(p-1)} (k \neq 0),$$

where p is any of integers between 1 to N.

* * * * *